US006933874B2

(12) United States Patent
Pentakota

(10) Patent No.: US 6,933,874 B2
(45) Date of Patent: Aug. 23, 2005

(54) APPLYING DESIRED VOLTAGE AT A NODE

(75) Inventor: Visvesvaraya A. Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/706,029

(22) Filed: Nov. 13, 2003

(65) Prior Publication Data

US 2005/0104760 A1 May 19, 2005

(51) Int. Cl.[7] .......... H03M 1/78
(52) U.S. Cl. .......... 341/154; 341/155
(58) Field of Search .......... 341/154, 155, 341/156, 118, 120

(56) References Cited

U.S. PATENT DOCUMENTS 4,459,580 A * 7/1984 Furukawa .......... 341/144
5,376,937 A * 12/1994 Colleran et al. .......... 341/159
5,592,167 A * 1/1997 Caruso et al. .......... 341/159
5,703,588 A * 12/1997 Rivoir et al. .......... 341/159
6,384,817 B1 * 5/2002 Janssen et al. .......... 345/204

* cited by examiner

*Primary Examiner*—Peguy Jeanpierre
*Assistant Examiner*—Joseph Lauture
(74) *Attorney, Agent, or Firm*—W. Daniel Swayze, Jr.; W. James Brady; Frederick J. Telecky, Jr.

(57) ABSTRACT

To apply a desired voltage at a node driving a load impedance, a voltage source providing the desired voltage is connected to the node. In addition, a current source supplying an amount of current that would be drawn by the impedance if the voltage source alone were connected across the impedance. As a result, the voltage source may be freed substantially from supplying current, which may be advantageously used in several situations. For example, the approach can be used to connect a voltage source directly to a high load without potentially requiring a buffer between the voltage source and the node. Alternatively, the approach can be used to apply the same desired voltage at each of multiple nodes connected in series using the same voltage source without being affected by the routing resistance generally present between each pair of the nodes.

16 Claims, 10 Drawing Sheets

APPLYING DESIRED VOLTAGE AT A NODE

BACKGROUND OF THE INVENTION

1. Field of the Invention

The present invention relates to the design of electrical circuits, and more specifically to a method and apparatus for applying a desired voltage at a node.

2. Related Art

It is often desirable to apply a desired voltage at a node of an electrical circuit. For example, it may be desirable to apply a specific voltage (termed as a reference voltage) at specific point(s) of an analog to digital converter (ADC). The reference voltage generally specifies a maximum voltage corresponding to the biggest digital code sought to be generated by the ADC. The reference voltage is typically used to perform operations such as converting an analog signal into corresponding digital code and vice versa, as is well known in the relevant arts.

Various approaches are attempted to provide such a desired voltage at a node. In one scenario in which a high load is connected to the node, a buffer is provided between the node and a voltage source. The buffer samples a voltage level provided by the voltage source, and drives the high load. As a buffer provides high impedance, the amount of current drawn from the voltage source is minimized as is generally desirable. One problem with such a buffer based solution is that the buffer may introduce an unacceptable amount of noise in several environments.

Additional/different problems may be presented in other environments in which a desired voltage is to be applied at a node. For example, it may be desirable to apply the same desired voltage level at multiple nodes of a circuit, with each node potentially presenting low, high, and/or different loads. It may be further desirable to share the same voltage source among at least some of the nodes.

In such a scenario, the routing distance (and thus the routing resistance) from the voltage source to each node varies, and the different distances (routing resistance) generally cause corresponding voltage drops. Thus, the voltage level applied at each node may not precisely equal the desired voltage, and the deviation from the desired voltage is generally proportionate to the distance from the voltage source. Such deviations may not be acceptable in several environments.

Accordingly, what is needed is a method and apparatus which applies a desired voltage at a node of an electrical circuit.

BRIEF DESCRIPTION OF THE DRAWINGS

Various features of the present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

An aspect of the present invention enables a desired voltage to be applied at a node by having a voltage source generate the desired voltage, and by having a current source supply the same amount of current as would be drawn at the node if the voltage source were directly connected to the node. Due to the use of the current source, the voltage source is substantially freed from the necessity to provide the current which may be otherwise required (without the use of the current source). Such a feature can be advantageously used in several scenarios as described below.

For example, in one embodiment, when the node is connected to an impedance having a high load, the current source may be designed to generate the same amount of current as the current that would be drawn by the high load. As a result, the voltage source may be connected directly to the high load (or impedance) without using an intermediate buffer. By avoiding a buffer, the signal-to-noise-ratio (SNR) performance of the overall implementation may be enhanced.

In another example embodiment, the same desired voltage is applied at multiple nodes connected to corresponding impedances using a shared voltage source (providing the desired voltage) without being affected by the routing resistance that would be present from the voltage source to each node. The same voltage (provided by the shared voltage source) may be attained by using a current source at each of the nodes, with each current source generating an amount of current that would be transmitted through a corresponding effective impedance if the desired voltage were applied across the effective impedance. As a result, the voltage drop across any routing resistance may also be substantially minimized/reduced, thereby ensuring that the same desired voltage is applied at all the nodes.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

The description is continued with reference to two example scenarios in which improvements can be attained according to various aspects of the present invention. First, the two example scenarios are described with reference to FIGS. 1A and 2A, and the corresponding improvements are then described with respect to FIGS. 1B and 2B.

2. Example Scenarios

Figure 1B:
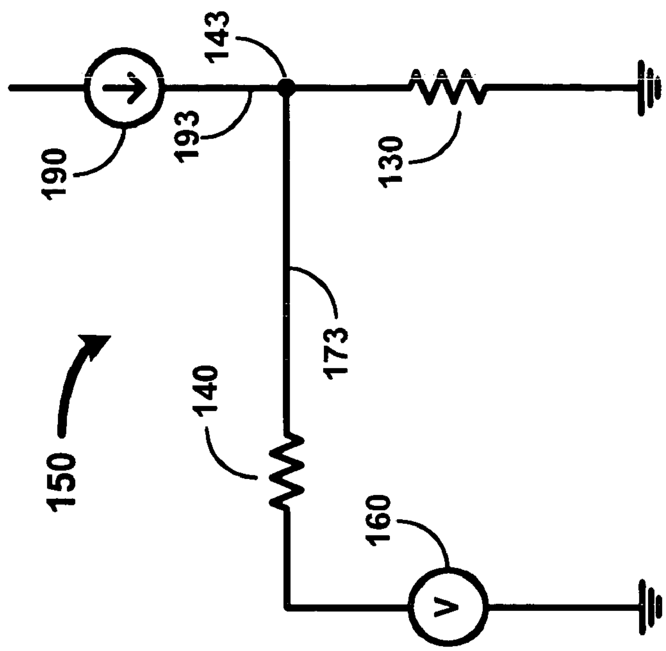
FIG. 1B is a circuit diagram illustrating the manner in which a voltage source may be connected to a high load without the use of an intermediate buffer according to an aspect of the present invention.
Figure 1A:
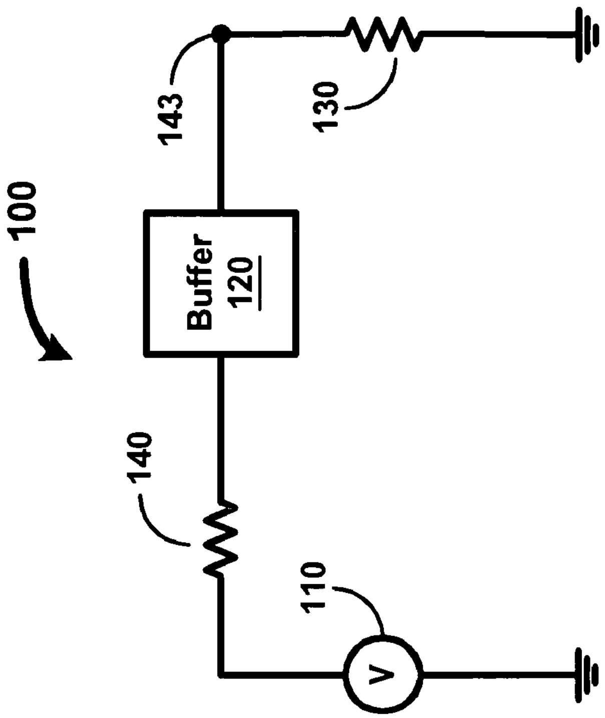
FIG. 1A is a prior circuit diagram illustrating the need for a buffer between a voltage source and a node connected to a high loads in one prior embodiment.

FIG. 1A is a circuit diagram illustrating an example prior circuit 100 containing voltage source 10, buffer 120, load resistor 130, and routing resistor 140. It is assumed that a desired voltage is to be applied at node 143 and load resistor 130 offers a high load (or draws substantial current). Buffer 120 senses the voltage level generated by voltage source 110, and drives load resistor 130 via node 143.

Voltage source 110 may be designed to cause the desired voltage to be applied at node 143 by taking into consideration the characteristics of buffer 120, etc. However, the use of the buffer generally degrades the signal to noise ratio (SNR) performance at node 143, and may thus be undesirable. In addition, voltage drop across routing resistor 140 may cause reduction in the desired voltage to be applied at node 143.

An aspect of the present invention enables the desired voltage to be applied at node 143 without the use of buffer 120 as described in a section below with reference to FIG. 1B (after the description on an example scenario with reference to FIG. 2A).

Figure 2A:
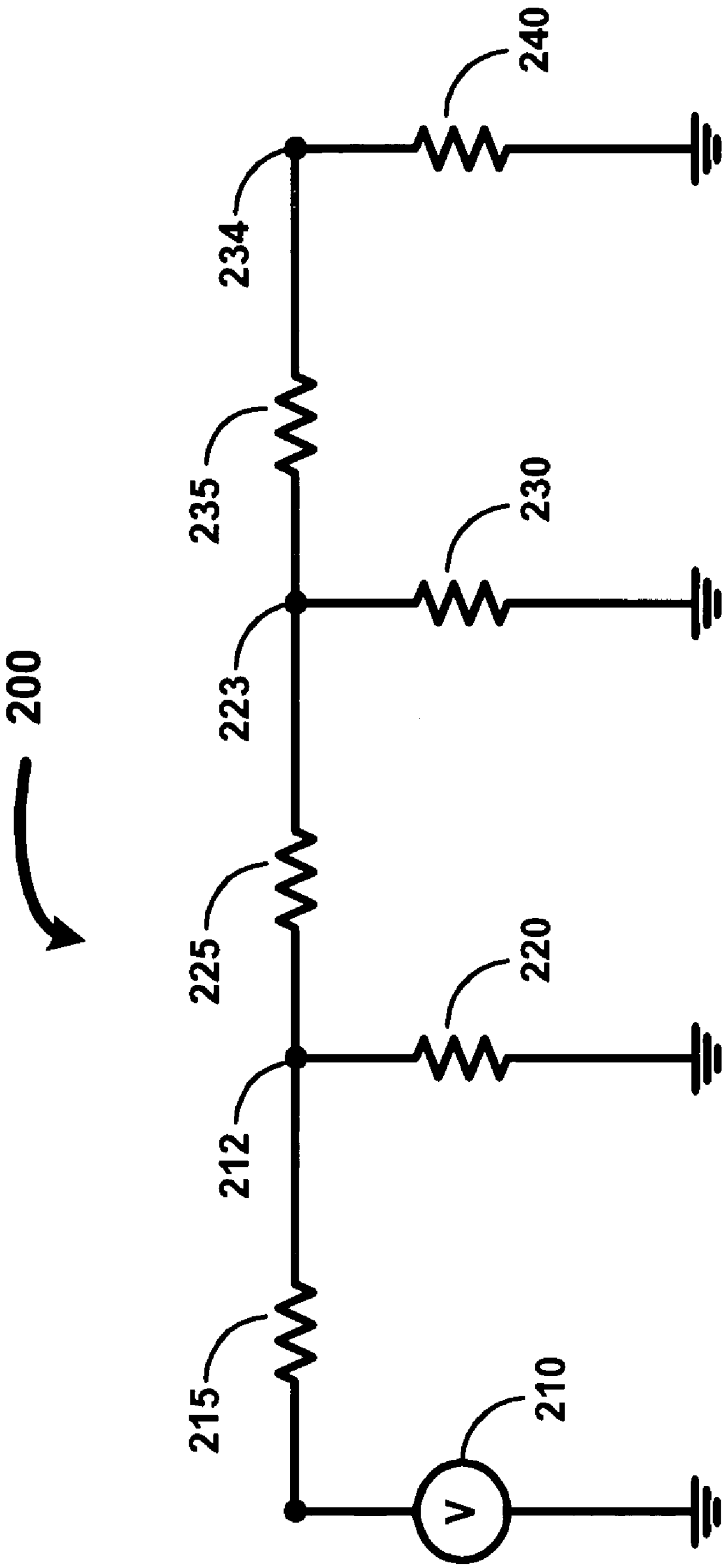
FIG. 2A is a prior circuit diagram illustrating the manner in which voltage drop across different routing resistors leads to different voltage levels to be applied on a series of nodes in one prior embodiment.

FIG. 2A is a circuit diagram illustrating some example problems encountered in a prior circuit in which the same voltage is desirable at multiple nodes connected in series. The circuit is shown containing nodes 212, 223 and 234, respectively connected to corresponding load impedances (shown as resistors) 220, 230 and 240. Impedances 220, 230, and 240 represent the amount of load offered by the circuit at nodes 212, 223 and 234 respectively.

A common voltage source 210 is shown used to apply a desired voltage at nodes 212, 223 and 234. Resistors 215, 225, and 235 represent the impedance present in the path from voltage source to each node. For example, resistor 215 represents the routing resistance from voltage source to node 212, resistor 225 represents the routing resistance from node 212 to node 223, and resistor 235 represents the routing resistance from node 223 to node 234.

As may be readily appreciated, current flows each of the routing resistors (215, 225 and 235) and a voltage drop results across these resistors. The voltage applied at different nodes (212, 223, and 234) is different due to the voltage drop across each of the routing resistors. For example, the voltage at node 223 is less than the voltage at node 212 (drop due to only resistor 215) due to the drop across both resistors 215 and 225 at node 223. An aspect of the present invention enables the desired voltage to be applied at all the nodes 212, 223, and 234 as described in a section below with reference to FIG. 2B (after the description with reference to FIG. 1B).

3. Improvements

Figure 2B:
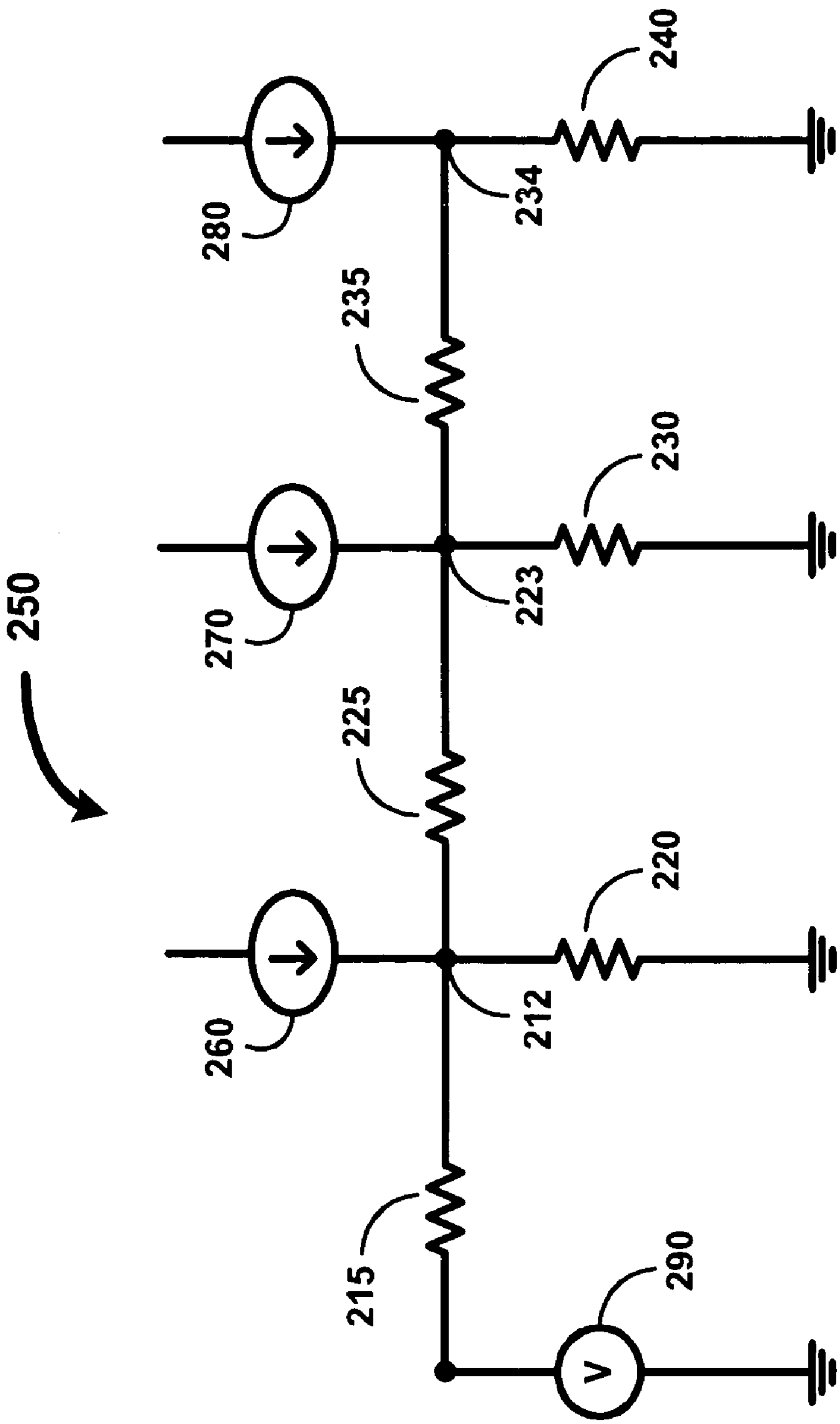
FIG. 2B is a circuit diagram illustrating the manner in which the same desired voltage may be applied on all of a series of nodes independent of any intermediate routing resistance according to an aspect of the present invention.

The circuits of FIGS. 1B and 2B illustrate the respective improvements attained over the circuits of FIGS. 1A and 2A according to various aspects of the present invention. Broadly, in addition to a voltage source providing the desired voltage, a current source is introduced at each node, with the current source supplying an amount of current equal to the current that would otherwise pass through impedance/load connected at that node without the use of the current source. Due to the supply of the current, no current may flow from the voltage source. As a result, the voltage provided by the voltage source is directly applied at each of the nodes as illustrated in further detail below with reference to FIGS. 1B and 2B.

FIG. 1B is a circuit diagram illustrating the manner in which the circuit of FIG. 1A can be modified to achieve a desired voltage at node 143 according to an aspect of the present invention. Example circuit 150 is shown containing voltage source 160, routing resistor 140, load resistor 130 and current source 190. In comparison to circuit 100 of FIG. 1A, example circuit 150 is shown containing current source 190 in addition, but with buffer 120 removed.

Voltage source 160 is shown connected to node 143 via voltage path 173 and current source 190 is shown connected to node 143 on current path 193. Voltage source 160 generates a voltage equal to the desired voltage (to be applied) at node 143. As described below, the voltage generated by voltage source 160 is applied (present) at node 143.

Current source 190 supplies an amount of current equal to the desired voltage level divided by the resistance of load resistor 130. As may be appreciated, that amount equals the amount of current that would otherwise flow through resistor 130 without current source 190 being present.

In operation, due to the flow of current supplied by current source 190 in resistor 130, the desired voltage would be present across resistor 130. Thus, the desired voltage would be applied at node 143.

Current source 190 may also introduce noise, but the corresponding current component would generally flow through voltage source 160 but not to load resistor 130. Thus, the noise introduced may not at least substantially affect the operation of load resistor.

In addition, as node 143 is at the same voltage potential as that generated by voltage source 160, no current would flow through resistor 140. If current source 190 generates slightly more current than required, the extra current would flow to voltage source 160.

Similarly, if current source 190 generates slightly less current than required, voltage source 160 provides the remaining (deficient amount) current to ensure the desired voltage is applied at node 143. Thus, in general, a current source generally needs to generate only an approximate amount of current that would be drawn by the load (or impedance, in general) to attain the advantages of various features of the present invention.

The description is continued with reference to the manner in which the scenario described above with reference to FIG. 2A can be improved to apply the same desirable voltage at multiple nodes.

FIG. 2B is a circuit diagram illustrating the manner in which the circuit of FIG. 2A can be modified to achieve the same desired voltage at each of the nodes 212, 223, and 234 according to an aspect of the present invention. In addition to the components in the circuit of FIG. 2A, example circuit 250 is shown containing current sources 260, 270 and 280 respectively at nodes 212, 223, and 234. Voltage source 210 is shown replaced by voltage source 290.

Voltage source 290 generates a voltage level equaling the desired voltage. By using a common voltage source generating the desired voltage, the same voltage is applied at each of the nodes 212, 223 and 234 as described below with reference to the operation of the current sources.

Each of the current sources supplies an amount of current equal to the desired voltage level divided by the resistance of resistor connected at each node. For example, current source 260 supplies the amount of current equal to the desired voltage divided by the resistance of load resistor 220. Similarly, each of current sources 270 and 280 supplies an amount of current (approximately) equal to the desired voltage divided by the resistance of load resistors 230 and 240 respectively.

In an embodiment in which resistance of load resistors 220, 230 and 240 is equal, the amount of current supplied by current sources 260, 270, and 280 would also be equal. For example, if the desired voltage is 'V' and the resistance of load resistors 220, 230 and 240 is 'R', then the current required to be supplied by the current sources is V/R.

If current supplied by current sources is V/R, then no current flows through routing resistors 215, 225, and 235 and hence no voltage drop occurs across the routing resistors. Due to the absence of voltage drop across the routing resistors (215, 225 and 235), the desired voltage (generated by voltage source 210) would be applied at nodes 212, 223, and 234.

As may be readily appreciated, voltage source 210 generates the desired voltage, and each current source supplies the required current to ensure that the desired voltage is present at each node. The path (or portion thereof) connecting the current source to the node is referred to as a current path, and the path connecting the voltage source to the node is referred to as a voltage path. The manner in which the current source may be implemented is described below with reference to FIG. 3.

3. Current Source

Figure 3:
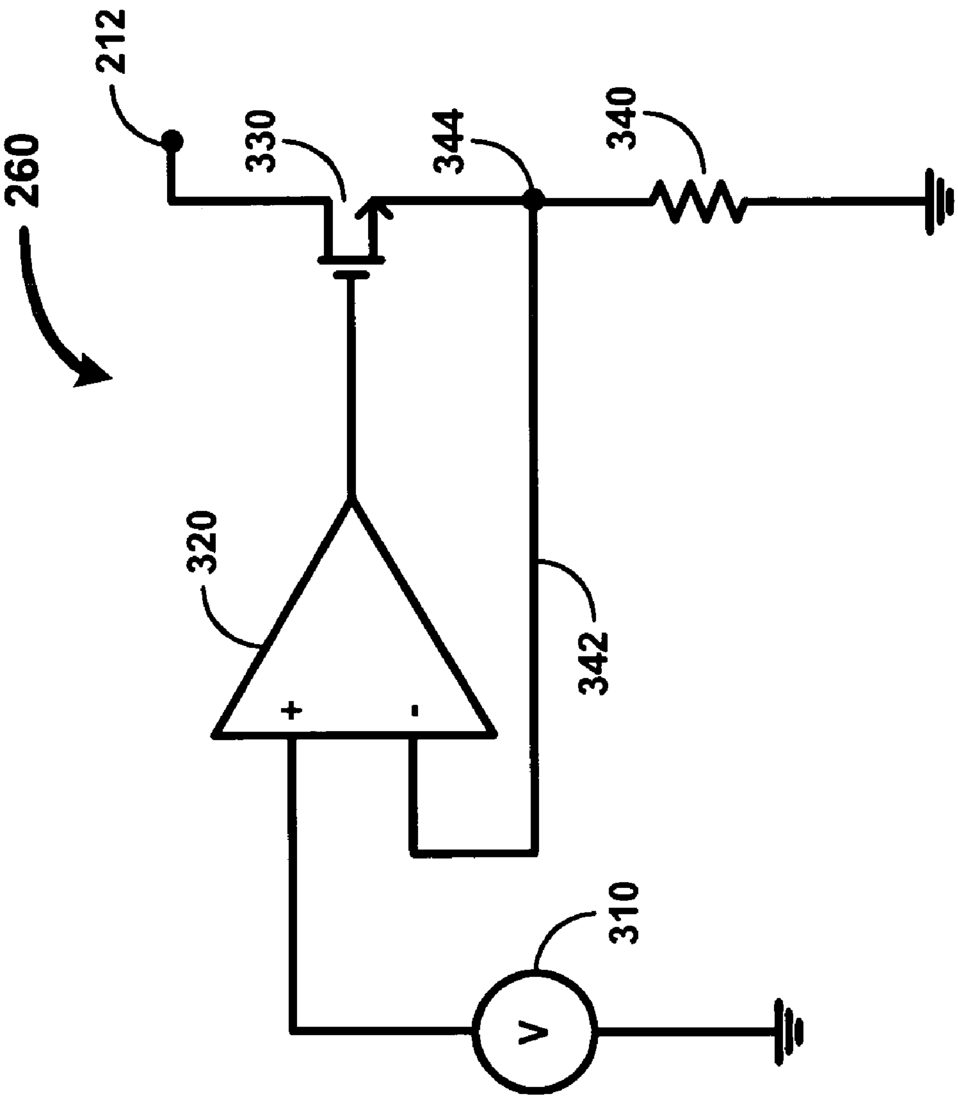
FIG. 3 is a circuit diagram illustrating the details of an example current source used to apply a desired voltage at a node.

FIG. 3 is a circuit diagram illustrating the details of current source 260 in one embodiment. Current sources 190, 270 and 280 may also be implemented similarly. However, any of the current sources can be implemented in several other ways as is well known in relevant arts. Current source 260 is shown containing voltage source 310, operational amplifier 320, transistor 330, and resistor 340. Each component is described in further detail below.

Voltage source 310 generates a voltage equal to the desired voltage to be applied at node 212. Though shown as separate blocks, voltage source 310 may be implemented using the same unit as the voltage source providing the desired voltage level. The resistance of resistor 340 equals the resistance of load resistor 220. Operational amplifier 320 is shown connected to voltage source 310 at non-inverting terminal and resistor 340 on inverting terminal. The output of operational amplifier 320 is connected to transistor 330.

As operational amplifier 320 offers high input impedance, the voltage at inverting terminal on path 342 (also at node 344) would also equal the desired voltage. As no current flows through path 342, the current that would flow through resistor 340 equals the current that flows on path 212. The current that flows through resistor 340 in turn equals the desired voltage divided by the resistance of resistor 340.

As the resistance of resistor 340 equals resistance of load resistor 220, current equaling the desired voltage divided by the resistance of load resistor 220 is provided through node 212 as desired. Current sources 190, 270, and 280 may also be implemented similarly. The above described approaches may be used in several environments. An example environment is described below with reference to FIGS. 4A and 4B.

4. ADC

Figure 4A:
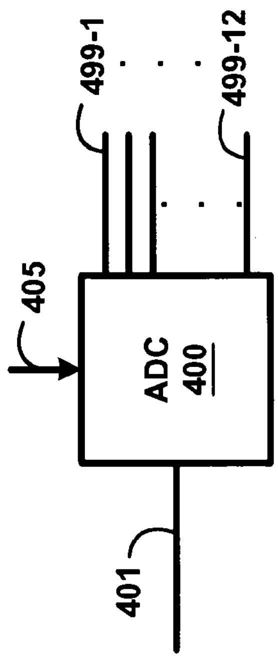
FIG. 4A is a block diagram illustrating the general operation of an ADC in one embodiment.

FIG. 4A is a block diagram illustrating the general operation of an analog to digital converter (ADC). ADC 400 is shown receiving an analog signal on path 401 and reference voltage on path 405. ADC 400 converts a sample of the analog signal into 12-bit digital code using the reference voltage, and provides the digital code on lines 499-1 through 499-12.

ADCs are implemented using multiple stages, particularly as the number of bits (N) generated by the ADC is large, for reasons well known in the relevant arts. An example embodiment containing such multiple stages is described below with reference to FIG. 4B.

Figure 4B:
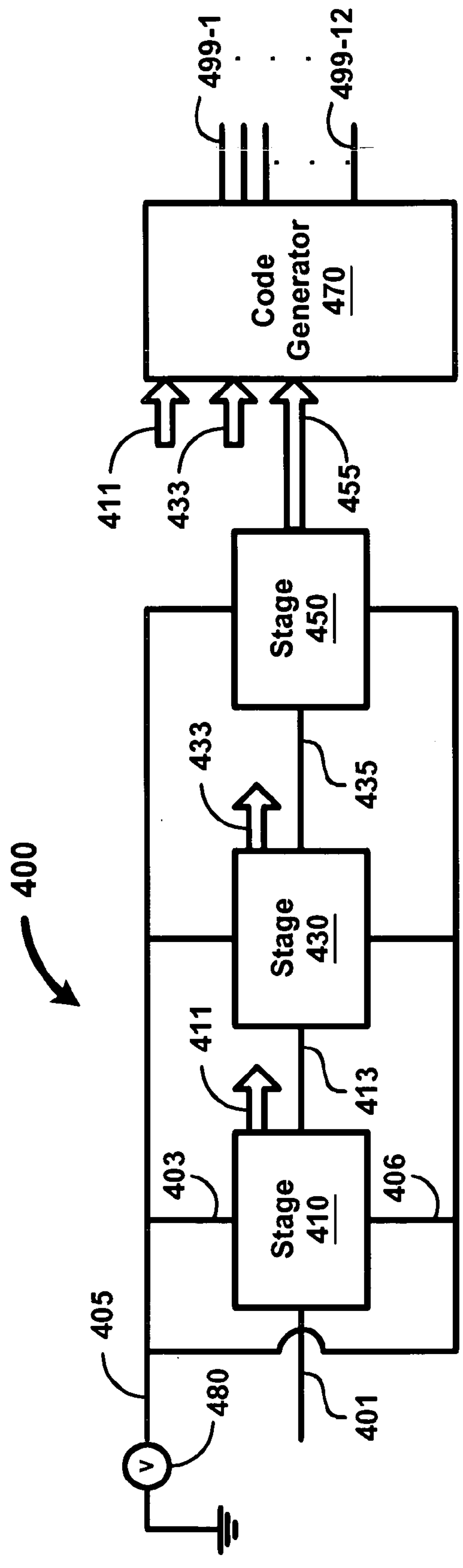
FIG. 4B is a block diagram illustrating the details of an ADC containing multiple stages in one embodiment.

FIG. 4B is a block diagram illustrating the details of ADC 400 in one embodiment. ADC 400 is shown containing multiple stages 410, 430 and 450, code generator 470, and voltage source 480. Voltage source 480 supplies a reference voltage Vref ("desired voltage") to each stage, and the same voltage (level) needs to be applied to all the stages.

Each stage (410, 430 and 450) use Vref to generate a P-bit sub-code corresponding to a voltage level of an analog signal received as an input. For example, stage 430 coverts a voltage level on path 413 to generate a P-bit sub-code on path 433. The accuracy of generation of the P-bit generally depends on the accuracy of the received voltage, and thus it is desirable that Vref be equal to all the stages.

Code generator 470 generates the N-bit (corresponding to the voltage level on path 401) based on the sub-codes generated by stages 410, 430 and 450. In an embodiment, each P-bit code contains an 'additional bit' for error correction. For example, assuming that N= 15, each stage may generate a 6-bit code, with the extra $6^{th}$ bit providing for error correction. In general, the $6^{th}$ bit has a weight of half of the least significant bit of the 5 bits (of the 15 bits) each sub-ADC may need to otherwise generate.

Each stage, except last stage 450, generates an output signal which represents ((Vi−Vdac)×Gain), wherein Vi represents the voltage level of the analog signal, Vdac equals ((sub-code×Vref)/$2^{P-1}$), with P representing the number of bits in the generated sub-code, gain equals $2^P$, − representing a subtraction operation, and x representing a multiplication operation. The manner in which each stage can be implemented is described below with reference to FIG. 5 in further detail.

5. Stage

Figure 5:
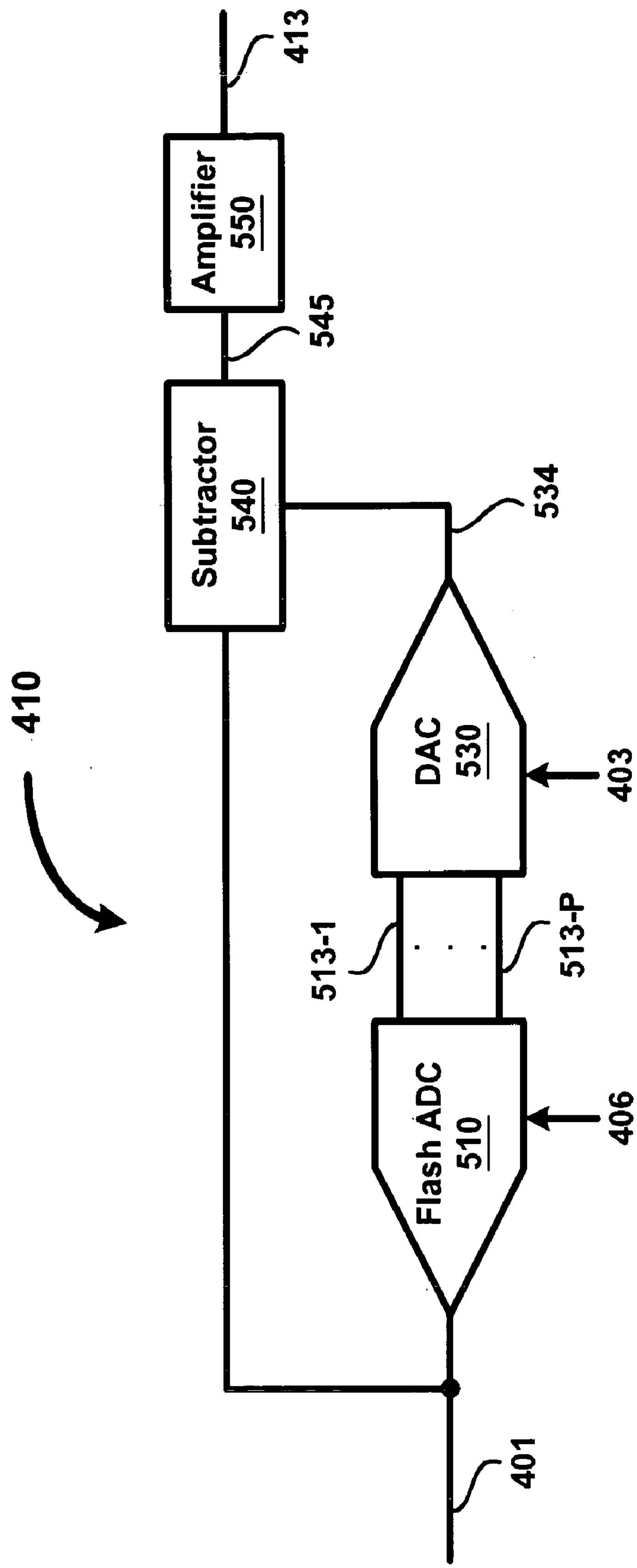
FIG. 5 is a block diagram illustrating a logical view of the details of a stage of an ADC containing a flash ADC in one embodiment.

FIG. 5 is a block diagram illustrating the logical view of stage 410 of ADC 400 in one embodiment. The description is provided with reference to stage 410 merely for illustration, however, stages 430 and 450 may also be implemented in a similar manner. Stage 410 is shown containing flash ADC 510, digital to analog converter 530, subtractor 540, and amplifier 550. Each block is described in detail below.

Flash ADC 510 (an example of a sub-ADC) converts a sample of the analog signal received on path 401 into a corresponding P-bit sub-code using a threshold reference voltage (Vt1) received on path 406. The P-bit sub-code is provided on paths 513-1 through 513-P (contained in path 411 of FIG. 4B, and P is less than N). The manner in which flash ADC 510 may be implemented is described in further detail in sections below.

DAC 530 converts the sub-code received on paths 513-1 through 513-P into corresponding analog signal (Vdac) on path 534 using another threshold reference voltage (Vt2) on path 403. The threshold voltages Vt1 and Vt2 are shown (in FIG. 4B) derived from a common reference voltage 405, however, the Vt1 and Vt2 may not precisely equal Vref due to the routing resistance in the path.

Subtractor 540 generates the difference of the analog signal 401 (Vi) and the analog signal received on path 534 (Vdac). The difference voltage (Vi−Vdac) is provided on path 545. In one known embodiment, subtractor 540 and DAC 530 are implemented using capacitors which are charged to the input signal voltage in one phase (sampling phase) of a clock cycle, and amplified using amplifier 550 in another phase (hold phase).

Amplifier 550 amplifies the difference voltage with a gain of $2^{P-1}$, wherein P represents the number of bits in the sub-code generated by stage 410 The amplified signal ((Vi−Vdac)×Gain) is provided on path 413 to resolve the remaining bits in the N-bit digital code by the next ADC stages. Thus, the last stage 450 may not contain DAC, subtractor and amplifier. The description is continued with reference to an example implementation of flash ADCs contained in the remaining stages.

6. Flash ADC

Figure 6:
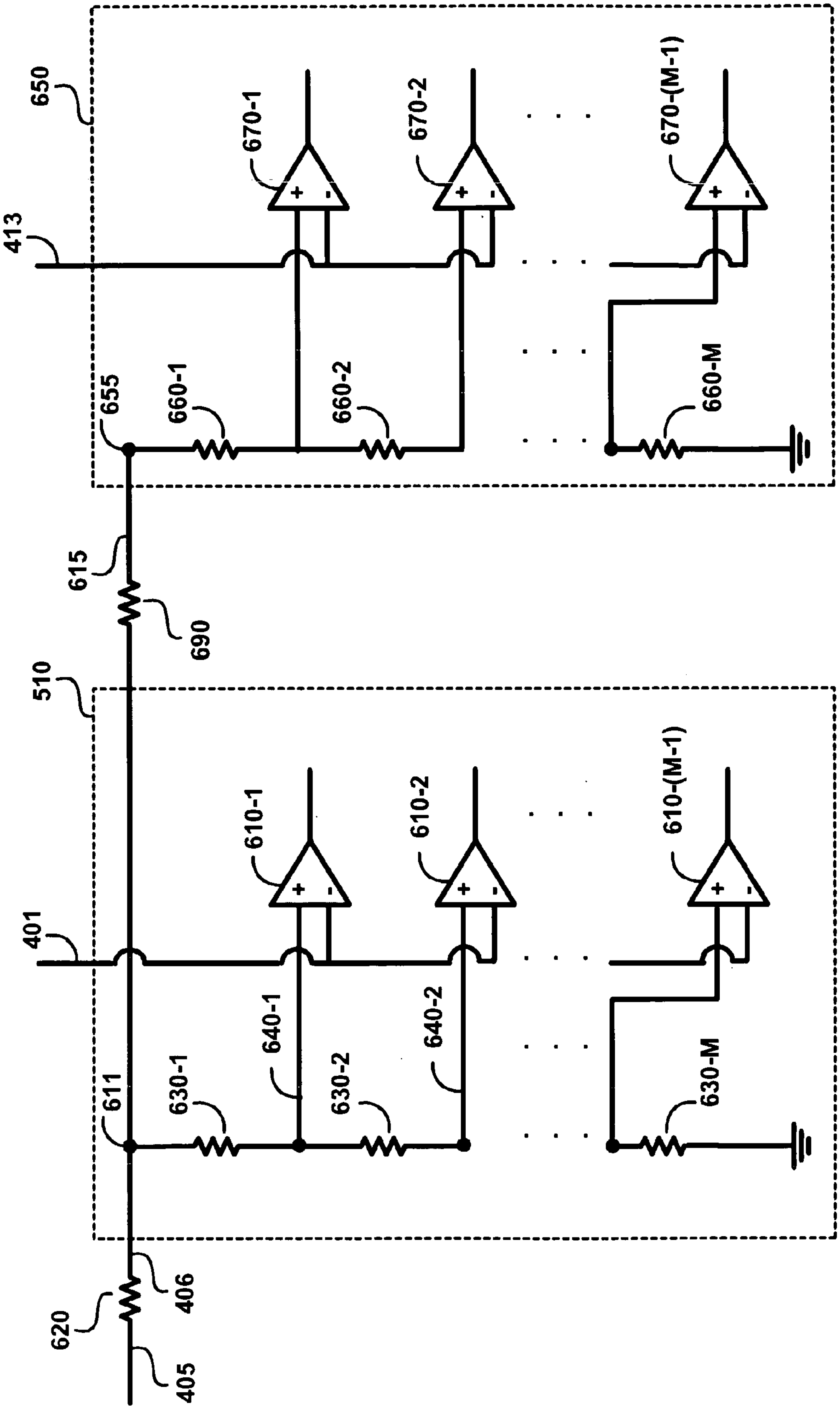
FIG. 6 is a circuit diagram illustrating the details of a flash ADC in one prior embodiment.

FIG. 6 is a circuit diagram illustrating the details of flash ADC 510 in one prior embodiment. For illustration, stages 410 and 430 of FIG. 4B are assumed to be containing flash ADCs 510 and 650 respectively. For conciseness, only two stages of ADC 400 are described as containing a flash ADC, however, the number of flash ADCs generally depends on the number of stages employed in an ADC.

Flash ADC 510 is shown containing comparators 610-1 through 610-(M−1) and resistors 630-1 through 630-M (together forming a load resistor at node 611), wherein M equals $2^P$ and P equals the number of bits in the corresponding sub-code. Flash ADC 510 is shown receiving a threshold voltage (Vt1) on path 406 from reference voltage (Vref) on path 405 through routing resistor 620 (representing the resistance of routing path from Vref to Vt1). As noted above, flash ADC 510 converts the analog signal received on path 401 into corresponding sub-code on paths 513-1 through 513-P using Vt1 (the desired voltage equaling Vref). The manner in which such a conversion may be performed is described below.

Resistors 630-1 through 630-M form a resistor ladder (RDAC), with a junction of each pair of resistors providing one of the comparison voltages to comparators 610-1 through 610-(M−1) respectively. In an embodiment in which the resistance of all resistors 630-1 through 630-M is equal, the voltage drop across each resistor equals Vt1/M and the remaining voltage (i.e., Vt1—aggregate of voltage drops) is provided as a comparison voltage at a node between the two adjacent resistors. For example, assuming that P is 2, then the comparison voltages on paths 640-1 and 640-2 respectively equal 3*Vt1/4 and 2*Vt1/4 (wherein * represents multiplication operator) respectively.

Each of comparators 610-1 through 610-(M−1) compares the analog input signal received on path 401 and the corresponding comparison voltage received. Each comparison result indicates whether the voltage level of the sample received on path 401 is greater than the corresponding comparison voltage. The ($2^P$) comparison results can be provided as an input to an encoder (not shown) to generate the P-bit sub-code.

Flash ADC 650 also operates similar to flash ADC 510, and thus converts the analog signal received on path 413 into P-bit sub-code using the threshold voltage (Vt1) received on path 615 (contained in path 413). The description is continued with reference to some example problems in the operation of such a prior ADC.

7. Problems with Flash ADCs

One problem with flash ADCs 510 and 650 of FIG. 6 is that the threshold voltages that would be applied to the resistor ladders at nodes 611 and 655 are different, and none may equal Vref (desired voltage) due to routing resistors 620 and 690 respectively. Routing resistors 620 and 690 represent the resistance of the respective routing paths from voltage source 480 (of FIG. 4B). There is generally at least some of amount current present in paths 620 and 690 (similar to in resistors 215, 225 and 235 of FIG. 2A), and the resulting voltage drop across the routing resistor causes the threshold voltage applied at nodes 611 and 655 would be different and not equal to Vref.

For accurate determination of a digital code corresponding to a sample, each of the voltages applied at nodes 611 and 655 may need to equal Vref (the desired voltage).

Another problem with such flash ADCs is that the voltage source (e.g., 480) generating the Vref required for each stage may not supply the amount of current required by each resistor ladder to attain the desired voltage if the load offered by the resistor ladder is high. However, as noted above, it is desirable to apply Vref to/at each stage of the pipeline ADC.

It may be appreciated that the above-noted problems parallel the points noted with reference to FIGS. 1A and 2A above. The description is continued with reference to the modifications to flash ADCs 510 and 650 to apply the desired threshold voltage according to an aspect of the present invention.

8. Modifications to Flash ADC

Figure 7:
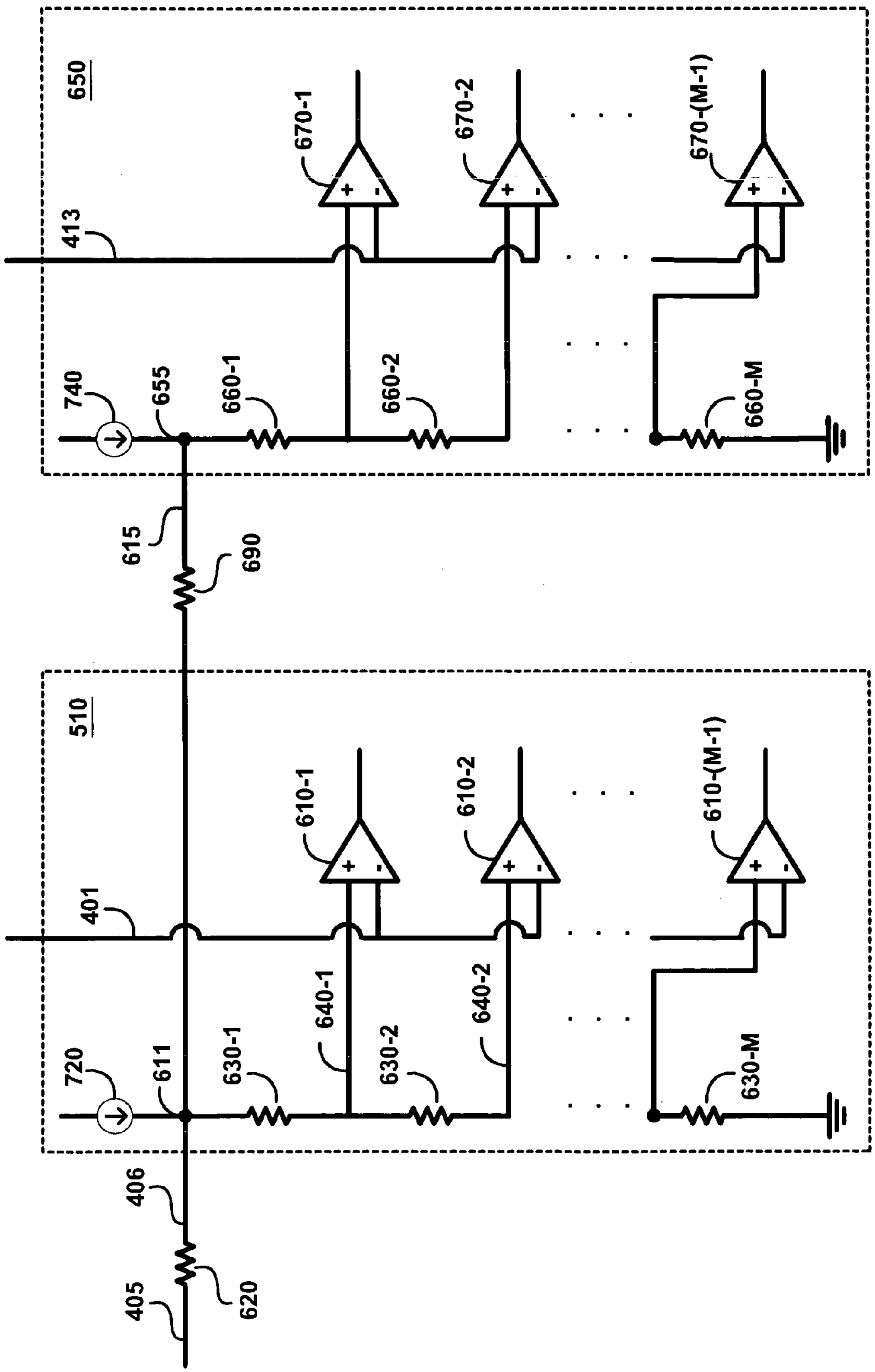
FIG. 7 is a circuit diagram illustrating the manner in which a desired voltage can be applied to multiple nodes contained in different flash ADCs according to an aspect of the present invention.

FIG. 7 is a circuit diagram illustrating the manner the prior circuit of FIG. 6 can be modified to apply Vref (desired voltage) at each of the nodes 611 and 655 contained in flash ADCs 510 and 650. Voltage source 480 is assumed to generate the desired voltage Vref, and is connected to path 405. The circuit diagram is shown containing current sources 720 and 740 (at nodes 611 and 655 respectively) in addition to the components of FIG. 6.

As may be readily observed, by modeling each of the resistor ladders within the flash ADCs as a single impedance (load resistor at the corresponding node), the combination of resistor ladders, current sources 720 and 740, routing resistors 620 and 690, and voltage source 480 together parallel the circuit of FIG. 2B.

In particular, current source 720 at node 611 supplies the amount of current equal to the desired voltage divided by the impedance of the resistor ladder containing resistors 630-1 through 630-M. Similarly, the current source at node 655 supplies the amount of current equal to the desired voltage divided by the impedance of the resistor ladder containing resistors 660-1 through 660-M. As a result, the voltage that occurs across each of the resistor ladders equals the reference voltage (Vref supplied by voltage source 480), as desired.

Even though the description of above is provided with reference to single-ended circuits, the approaches described above can be extended to differential circuits as described below with reference to FIGS. 8A and 8B.

9. Differential ADC

Figure 8B:
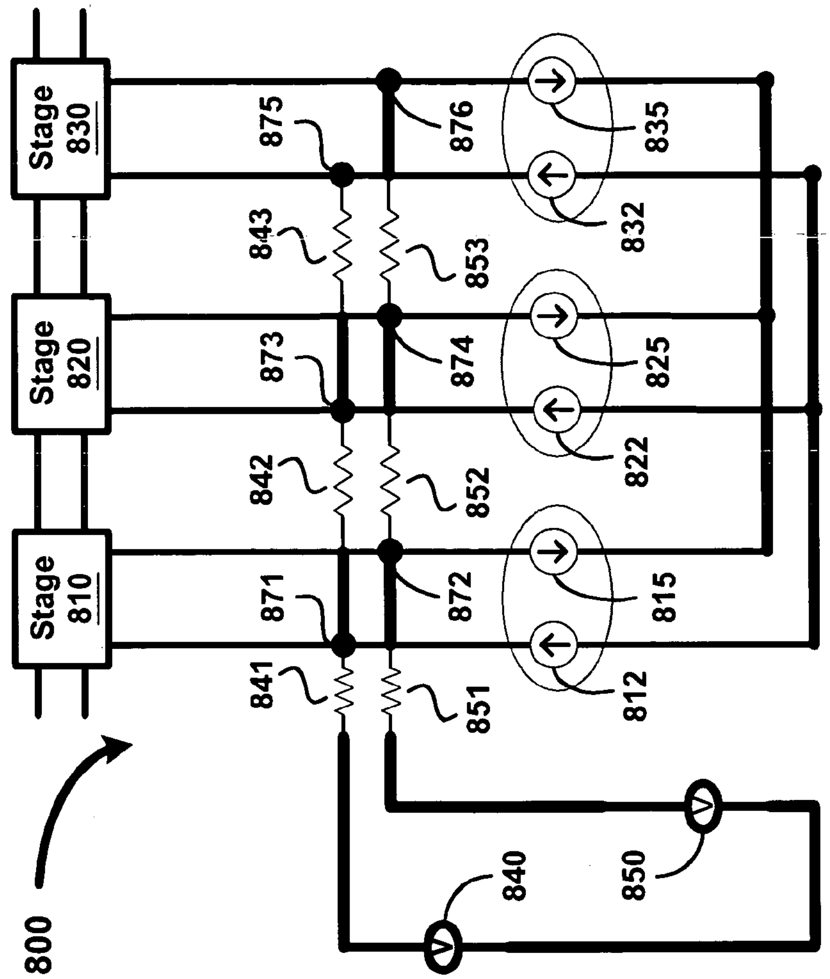
FIG. 8B is a block diagram illustrating the details of an ADC operating in differential mode in an embodiment of the present invention.
Figure 8A:
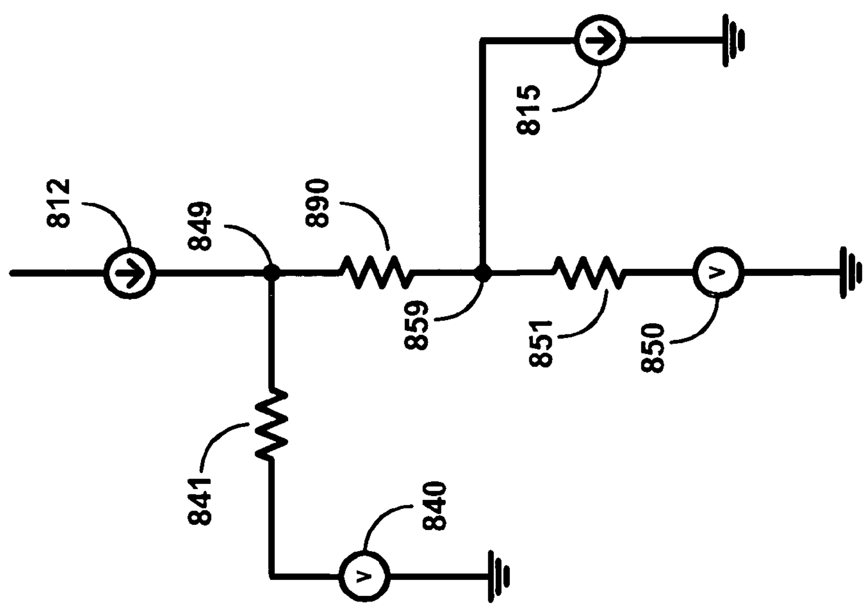
FIG. 8A is a circuit diagram generally illustrating the manner in a resistor ladder can be operated in a differential mode according to an aspect of the present invention.

FIGS. 8A and 8B are diagrams illustrating the manner in which the approaches described above can be extended to differential mode as well. In particular, FIG. 8A is a circuit diagram generally illustrating the manner in which a resistor ladder can be implemented in a differential mode. FIG. 8B is a block diagram illustrating the details of an ADC operating in differential mode in an embodiment of the present invention. The two FIGS. 8A and 8B are described in further detail below.

FIG. 8A is shown containing sourcing current source 812, sinking current source 815, voltage sources 840 and 850, routing resistors 841 and 851, and resistor 890. Resistor 890 represents the impedance offered by the resistor ladder. Routing resistors 841 and 851 represents the routing resistance from voltage sources 840 and 850 to nodes 849 and 859 respectively.

Voltage sources 840 and 850 are used to generate the desired voltage at nodes 849 and 859, and current sources 812 and 815 supply the required current to attain the respective desired voltages (which together provide the desired voltage in differential mode) at nodes 849 and 859 respectively. The currents supplied by current sources 812 and 815 respectively equal V840/R890 and V850/R851, wherein V840 and V850 represent the voltages generated by voltage sources 840 and 850, and R890 and R851 represent the respective resistance of resistors 890 and 851.

FIG. 8B is a block diagram illustrating the details of ADC 800 operating in differential mode in an embodiment of the present invention. ADC 800 converts a sample of an analog signal into corresponding digital code. ADC 800 is shown containing three stages 810, 820 and 830, with each stage generating sub-codes (which are together used to generate the digital code).

Stage 810 contains resistor ladders. (corresponding to ladders 851 and 890 in FIG. 8A), comparators, and two current sources in a flash ADC to generate sub-codes. Stages 820 and 830 may also be implemented similarly. The current sources are shown externally connected to each stage, even though the current sources can be viewed as being contained within the corresponding stages.

Thus, stage 810 contains current sources 812 and 815, stage 820 contains current sources 822 and 825, and stage 830 contains current sources 832 and 835. Each current source generates an amount of current equal to the desired voltage (at the connected node) divided by the load resistance connected to the node. For example, current source 812 generates an amount of current equaling a desired voltage generated by voltage source 840 divided by the resistance of the resistor ladder 812 within stage 810.

Voltage source 840 is used to generate a desired voltage at nodes 871, 873 and 875, and voltage source 850 is used to generate a desired voltage at nodes 872, 874 and 876. Routing resistors 841, 842, and 843 represent the routing resistance present in the path from voltage source 840 to the corresponding resistor ladder in each stage. Similarly, routing resistors 851, 852, and 853 represent the routing resistance present in the path from voltage source 850 to the corresponding resistor ladder in each stage.

Due to the supply of sufficient current by current sources, no current may flow through routing resistors 841-843, and 851-853 and no voltage drop would result across any of the routing resistors. As a result, the corresponding desired voltage generated by voltage source 840 is applied to nodes 871, 873 and 875, and the corresponding different voltage generated by voltage source 850 is applied to nodes 872, 874 and 876. Thus, a desired differential voltage can be provided to each stage.

From the above, it may be appreciated that the desired voltage (either single-ended or differential) can be applied at multiple nodes by using current sources in combination with voltage sources. The approaches described above can be implemented in various devices. The description is continued with reference to an example device in which various aspects of the present invention can be implemented.

10. Example Device

Figure 9:
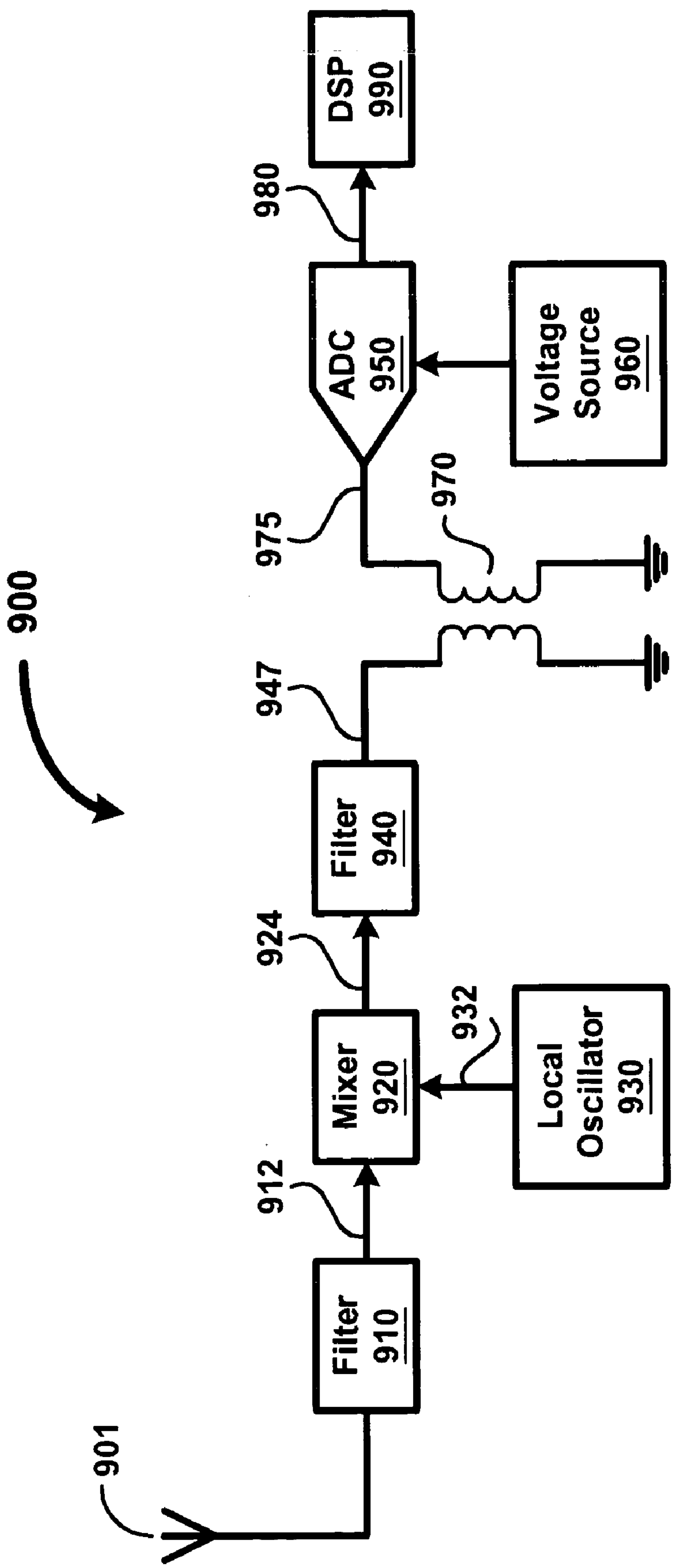
FIG. 9 is a block diagram of an example device in which the present invention can be implemented.

FIG. 9 is a block diagram of wireless base station system 900 illustrating an example system in which the present invention may be implemented. For illustration, it is assumed that wireless base station system 900 is implemented to transfer signals corresponding to mobile phone, etc. However, various aspects of the present invention can be implemented in other communication systems (e.g., data processing systems, etc.).

Wireless base station system 900 is shown containing antenna 901, filters 910 and 960, transformer 970, transmission line 980, and digital signal processor (DSP) 990. Each component is described in further detail below.

Antenna 901 may receive various signals transmitted from mobile phones, other wireless base stations, etc. The received signals may be provided to filter 910. Filter 910 may perform a corresponding transfer function to generate signals of the frequencies of interest. The generated signals are provided on path 912 to mixer 920. Antenna 901 and filter 910 may be implemented in a known way.

Local oscillator 930 generates a signal with a fixed frequency and provides the fixed frequency signal on path 932. In an embodiment, the signal (on path 932) of fixed frequency may be generated by a phase locked loop, crystal, etc. in a known way.

Mixer 920 may be used to convert a high frequency signal to a signal having any desired frequency. In an embodiment, a signal of frequency 1575 MHz is converted to a 4 Mhz signal. Mixer 920 receives filtered signal on path 912 and a signal of fixed frequency on path 932 as inputs and provides the signal with a desired frequency on path 924.

Filter 940 filters the signal received on path 924 to remove any noise components that may be present. In general, a mixer generates noise and the output of mixer contains various noise components including the signal with desired frequency. Filter 940 provides the signal with desired frequency only on path 947. Mixer 920, local oscillator 930, and filter 940 may also be implemented in a known way.

Transformer 970 amplifies the signal received on path 947 to generate an amplified signal. The amplified signal may be provided to analog to digital converter (ADC) 950 on path 975.

ADC 950 converts the analog signal received on path 975 to a corresponding digital code using a reference voltage received on path 965. Voltage source 960 generates the desired reference voltage and provides the same on path 965. The digital code may be provided to DSP 990 through transmission line 980. ADC 950 may be implemented similar to ADC 400 described above. DSP 990 (example of a processing block) receives the digital code to provide various user applications (such as telephone calls, data applications).

Thus, various aspects of the present invention described above can be used to apply a desired voltage at a node in a circuit.

11. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An apparatus for applying a desired voltage at a first node, said first node being connected to a load impedance, said apparatus comprising:

a voltage source coupled to said first node, said voltage source generating said desired voltage; and a current source also coupled to said first node, wherein said current source supplies an amount of current that would be approximately drawn by said load impedance by said desired voltage being applied at said first node, wherein said load impedance is characterized by a high load such that said current source enables said voltage source to be coupled to said first node without a buffer between said voltage source and said first node.

2. An apparatus for applying a desired voltage at a first node, said first node being connected to a load impedance, said apparatus comprising:

a voltage source coupled to said first node, said voltage source generating said desired voltage; and a current source also coupled to said first node, wherein said current source supplies an amount of current that would be approximately drawn by said load impedance by said desired voltage being applied at said first node, wherein said desired voltage is to be applied to a plurality of nodes including said first node, said plurality of nodes being connected in series with a corresponding routing resistance present between each pair of said plurality of nodes, each of said plurality of nodes being connected to a corresponding one of a plurality of load impedances, said apparatus further comprising:

a plurality of current sources, each of said plurality of current sources being coupled to a corresponding one of said plurality of nodes, each of said plurality of current sources supplying an amount of current approximately equal to said desired voltage divided by a load impedance driven by the corresponding coupled node, said plurality of current sources comprising said current source.

3. The apparatus of claim 2, wherein said current source comprises a resistor having a resistance equal to said load impedance.

4. An analog to digital converter (ADC) converting a sample of an analog signal to a digital code, said ADC comprising:

a plurality of stages, each of said plurality of stages generating a corresponding one of a plurality of sub-codes, each of said plurality of sub-codes containing at least one bit, wherein said sub-codes are used to generate said digital code, each of said plurality of stages comprising:

a resistor ladder having a first end and a second end, said first end of said resistor ladder being coupled to a voltage source providing a desired voltage, the first end of all of the resistor ladders being connected in series, said first end of said resistor ladder also being coupled to a current source, said current source supplying to said resistor ladder an amount of current approximately equal to said desired voltage divided by an impedance offered by said resistor ladder, wherein each of said plurality of stages further comprising:

a sub-ADC receiving an input signal and a reference voltage, said sub-ADC generating a corresponding one of said plurality of sub-codes;

a digital to analog converter (DAC) converting said corresponding one of said plurality of sub-codes into a corresponding intermediate voltage according to said reference voltage;

a subtractor subtracting said corresponding intermediate voltage from said input signal to generate a subtractor output; and an amplifier amplifying said subtractor output to generate said input signal for a next one of said plurality of stages, wherein said sample is provided as said input signal for the first one of said plurality of stages.

5. The ADC of claim 4, wherein said sub-ADC comprises said resistor ladder and said current source.

6. The ADC of claim 4, wherein said voltage source provides a reference voltage for said ADC.

7. The ADC of claim 4, wherein said ADC operates in a differential mode.

8. The ADC of claim 4, wherein said ADC operates in a single-ended mode.

9. A device processing an analog signal, said device comprising:

a voltage source providing a reference voltage;

a current source;

an analog to digital converter (ADC) converting a sample of said analog signal to a digital code, said ADC comprising:

a plurality of stages, each of said plurality of stages generating a corresponding one of a plurality of sub-codes, each of said plurality of sub-codes containing at least one bit, wherein said sub-codes are used to generate said digital code, each of said plurality of stages comprising:

a resistor ladder having a first end and a second end, said first end of said resistor ladder being coupled to said voltage source providing said reference voltage, the first end of all of the resistor ladders being connected in series, said first end of said resistor ladder also being coupled to said current source, said current source supplying to said resistor ladder an amount of current approximately equal to said desired voltage divided by an impedance offered by said resistor ladder; and a processing block receiving said digital code, wherein each of said plurality of stages further comprising:

a sub-ADC receiving an input signal and a reference voltage, said sub-ADC generating a corresponding one of said plurality of sub-codes;

a digital to analog converter (DAC) converting said corresponding one of said plurality of sub-codes into a corresponding intermediate voltage according to said reference voltage;

a subtractor subtracting said corresponding intermediate voltage from said input signal to generate a subtractor output; and an amplifier amplifying said subtractor output to generate said input signal for a next one of said plurality of stages, wherein said sample is provided as said input signal for the first one of said plurality of stages.

10. The device of claim 9, wherein said sub-ADC comprises said resistor ladder and said current source.

11. The device of claim 9, wherein said ADC operates in a differential mode.

12. The device of claim 9, wherein said ADC operates in a single-ended mode.

13. The device of claim 9, wherein said device comprises a wireless base station, said device further comprising:

an antenna receiving an external signal; and an analog processor processing said external signal to generate said analog signal.

14. An integrated circuit for applying a desired voltage at a first node, said first node being coupled to a load impedance, said integrated circuit comprising:

a voltage path connecting a voltage source to said first node, said voltage source providing said desired voltage; and a current path connecting a current source to said first node, wherein said current source supplies an amount of current that would be approximately drawn by said load impedance by said desired voltage being applied at said first node, wherein said load impedance is characterized by a high load such that said current source enables said voltage source to be coupled to said first node without a buffer between said voltage source and said first node.

15. An integrated circuit for applying a desired voltage at a first node, said first node being coupled to a load impedance, said integrated circuit comprising:

a voltage path connecting a voltage source to said first node, said voltage source providing said desired voltage; and a current path connecting a current source to said first node, wherein said current source supplies an amount of current that would be approximately drawn by said load impedance by said desired voltage being applied at said first node, wherein said desired voltage is to be applied to a plurality of nodes including said first node, said plurality of nodes being connected in series with a corresponding routing resistance present between each pair of said plurality of nodes, each of said plurality of nodes being connected to a corresponding one of a plurality of load impedances, said integrated circuit further comprising:

a plurality of current paths, each coupling a corresponding one of a plurality of current sources to a corresponding one of said plurality of nodes, each of said plurality of current sources supplying an amount of current approximately equal to said desired voltage divided by an impedance driven by the corresponding coupled node, said plurality of current sources comprising said current source and said plurality of current paths comprising said current path.

16. An integrated circuit for applying a desired voltage at a first node, said first node being coupled to a load impedance, said integrated circuit comprising:

a voltage path connecting a voltage source to said first node, said voltage source providing said desired voltage; and a current path connecting a current source to said first node, wherein said current source supplies an amount of current that would be approximately drawn by said load impedance by said desired voltage being applied at said first node, wherein said integrated circuit operates in a differential mode.

* * * * *